(12) United States Patent
Jeong et al.

(10) Patent No.: US 7,923,529 B2
(45) Date of Patent: Apr. 12, 2011

(54) OLIGOTHIOPHENE-ARYLENE DERIVATIVES AND ORGANIC THIN FILM TRANSISTORS USING THE SAME

(75) Inventors: Eun Jeong Jeong, Gyeonggi-do (KR); Chang Ju Kim, Gyeonggi-do (KR); Bang Lin Lee, Gyeonggi-do (KR); Sang Yoon Lee, Seoul (KR); Kook Min Han, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/390,841

(22) Filed: Feb. 23, 2009

(65) Prior Publication Data

US 2009/0256143 A1    Oct. 15, 2009

Related U.S. Application Data

(62) Division of application No. 11/084,794, filed on Mar. 21, 2005, now Pat. No. 7,541,424.

(30) Foreign Application Priority Data

Oct. 19, 2004  (KR) .................. 10-2004-0083618

(51) Int. Cl.
C08G 75/00  (2006.01)
C08G 75/06  (2006.01)
H01L 29/02  (2006.01)
H01L 29/08  (2006.01)

(52) U.S. Cl. ................... 528/373; 528/377; 257/40
(58) Field of Classification Search ............ 528/373, 528/377; 257/40
See application file for complete search history.

(56) References Cited

U.S. PATENT DOCUMENTS 6,107,117 A    8/2000   Bao et al.

FOREIGN PATENT DOCUMENTS

WO    WO 00/79617 A1   12/2000

OTHER PUBLICATIONS

David J. Brennan et al., "Polyfluorenes as Organic Semiconductors for Polymeric Field Effect Transistors", Mat. Res. Soc. Symp. Proc. vol. 771, 2003 Materials Research Society, pp. L6.1.1-L6.1.6.
Sandrine Martin et al., "Source / drain contacts in organic polymer thin film transistors", Mat. Res. Soc. Symp. Proc. vol. 771, 2003 Materials Research Society, pp. L6.2.1-L6.2.6.
Timmie W. Kelley, "High Performance Organis Thin Film Transistors", Mat. Res. Soc. Symp. Proc. vol. 771, 2003 Materials Research Society, pp. L6.5.1-L6.5.11.
Francis Garnier et al., "Molecular Engineering of Organic Semiconductors: Design of Self-Assembly Properties in Conjugated Thiophene Oligomers", J. Am. Chem. Soc., 1993, vol. 115, pp. 8716-8721.
H. Sirringhaus et al., "High-Resolution Inkjet Printing of All-Polymer Transistor Circuits", science, vol. 290, Dec. 15, 2000, pp. 2123-2126.

(Continued)

Primary Examiner — Duc Truong
(74) Attorney, Agent, or Firm — Harness, Dickey & Pierce, P.L.C.

(57) ABSTRACT

An oligothiophene-arylene derivative wherein an arylene having n-type semiconductor characteristics is introduced into an oligothiophene having p-type semiconductor characteristics, thereby simultaneously exhibiting both p-type and n-type semiconductor characteristics. Further, an organic thin film transistor using the oligothiophene-arylene derivative.

5 Claims, 4 Drawing Sheets

OTHER PUBLICATIONS

Audebert et al., First example—tetrazine; Elsevier Science B.V.; 2004; chem Abstract 140: 339765.

Halik et al.; Octupolar modecules—semiconductors; infineon Technologies AG, Germany, Feb. 2004; Chem Abstract 140:173273.

Divisia-Blohorn et al.; Conjugated—interactions; American Chemical Society; 2003; chem Abstract 139:59502.

Suzuki et al.; Organic luminescence device; Canon Labushiki Kaisha, Japan; 2003; chem Abstract 138:245328.

Sauvage et al.; Comjugated polyrotaxanes; Royal Society of Chemistry; 2002; chem Abstract 138:39668.

Office Action dated Oct. 25, 2010 for corresponding Korean Patent Application No. 10-2004-0083618.

Bang-Lin Lee, et al., "Syntheses of New Alternating CT-Type Copolymers of Thiophene and Pyrido [3,4-b]pyrazine Units: Their Optical and Electrochemical Properties in Comparison with Similar CT Copolymers of Thiophene with Pyridine and Quinoxaline", Macromolecules, vol. 32, pp. 1375-1382, 1999.

OLIGOTHIOPHENE-ARYLENE DERIVATIVES AND ORGANIC THIN FILM TRANSISTORS USING THE SAME

This application is a DIV of 11/084,794 filed Mar. 21, 2005 now U.S. Pat. No. 7,541,424.

This non-provisional application claims priority under 35 U.S.C. §119(a) on Korean Patent Application No. 2004-83618 filed on Oct. 19, 2004, which is herein expressly incorporated by reference.

BACKGROUND OF THE INVENTION

1. Field of the Invention

Embodiments of the present invention relate to an oligothiophene-arylene derivative and an organic thin film transistor using the derivative. More particularly, embodiments of the present invention relate to an oligothiophene-arylene derivative wherein an arylene having n-type semiconductor characteristics is introduced into an oligothiophene having p-type semiconductor characteristics, thereby simultaneously exhibiting both p-type and n-type semiconductor characteristics.

2. Description of the Related Art

General organic thin film transistors (OTFTs) comprise a substrate, a gate electrode, an insulating layer, source/drain electrodes, and a channel layer. Organic thin film transistors are classified into bottom-contact (BC) OTFTs wherein a channel layer is formed on source and drain electrodes, and top-contact (TC) OTFTs wherein metal electrodes are formed on a channel layer by mask deposition.

Inorganic semiconductor materials, such as silicon (Si), have been commonly used as materials for channel layers of TFTs. However, since the preparation of such inorganic semiconductor materials involves high costs and requires a high-temperature vacuum process to fabricate TFTs, organic semiconductor materials currently replace inorganic semiconductor materials in order to fabricate large area, flexible displays at reduced costs.

Recently, studies on organic semiconductor materials for channel layers of OTFTs have been actively undertaken and the characteristics of the devices have been reported. Of these, a great deal of research is currently concentrated on low molecular weight materials and oligomers, e.g., phthalocyanines, perylenes, pentacenes, C60, thiophene oligomers, and the like. Lucent Technologies Inc. and 3M Inc. developed devices with charge carrier mobilities as high as 3.2-5.0 cm$^2$/Vs using a pentacene (*Mat. Res. Soc. Symp. Proc.* 2003, Vol. 771, L6.5.1-L6.5.11). In addition, CNRS, France, reported a device having a relatively high charge carrier mobility of 0.01-0.1 cm$^2$/Vs and a relatively high on/off current ratio ($I_{on}/I_{off}$ ratio) using an oligothiophene derivative (*J. Am. Chem. Soc.*, 1993, Vol. 115, pp. 8716-9721).

However, since the prior art devices are largely dependent on vacuum processes for thin film formation, the fabrication of the devices incurs considerable costs.

On the other hand, high molecular weight-based organic thin film transistors (charge carrier mobility: 0.01-0.02 cm$^2$/Vs) employing a polythiophene-based material (F8T2) have already been fabricated and tested (PCT Publication WO 00/79617, *Science*, 2000, vol. 290, pp. 2132-2126). U.S. Pat. No. 6,107,117 discloses the fabrication of an organic thin film transistor with a charge carrier mobility of 0.01-0.04 cm$^2$/Vs by employing polythiophene P3HT, which is a representative regioregular polymer.

Since the regioregular polythiophene P3HT shows a charge carrier mobility of about 0.01 cm$^2$/Vs but a high off-state leakage current ($10^{-9}$ A or more), leading to a low $I_{on}/I_{off}$ ratio of 400 or less, it is not applicable to the fabrication of electronic devices.

Low molecular weight organic semiconductor materials for organic thin film transistors that can be spin-coated at room temperature and simultaneously satisfy the requirements of high charge carrier mobility and low off-state leakage current, have not hitherto been reported.

SUMMARY OF THE INVENTION

Therefore, embodiments of the present invention have been made in view of the above problems of the prior art, and it is an object of embodiments of the present invention to provide an oligothiophene-arylene derivative wherein an arylene having n-type semiconductor characteristics is introduced into an oligothiophene unit having p-type semiconductor characteristics, thereby enabling spin-coating at room temperature and simultaneously exhibiting both high charge carrier mobility and low leakage current.

In accordance with one aspect of the present invention, there is provided an oligothiophene-arylene derivative represented by Formula 1 below:

Formula I

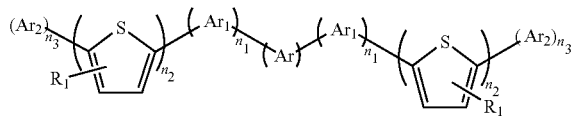

wherein

Ar is a $C_{2-30}$ heteroarylene interrupted by at least one nitrogen atom which may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

$Ar_1$ is a $C_{2-30}$ aryl group which may be interrupted by at least one heteroatom and may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

$Ar_2$ is a $C_{5-30}$ aryl group which may be interrupted by at least one heteroatom and may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

the substituents $R_1$ are each independently hydrogen, hydroxyl, amino, $C_{1-20}$ linear, branched or cyclic alkyl, $C_{1-20}$ alkoxyalkyl, alkylamino, ester, amido, or a $C_{1-16}$ linear, branched or cyclic alkoxy, alkylamino, ester or amido;

$n_2$ is an integer between 2 and 8; and $n_1$ and $n_3$ are each independently an integer between 0 and 6.

In accordance with another aspect of the present invention, there is provided an organic thin film transistor in which the oligomer material is used as a material for an organic active layer, thereby enabling spin-coating at room temperature and simultaneously satisfying the requirements of high charge carrier mobility and low off-state leakage current.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF THE PREFERRED EMBODIMENTS

Figure 1:
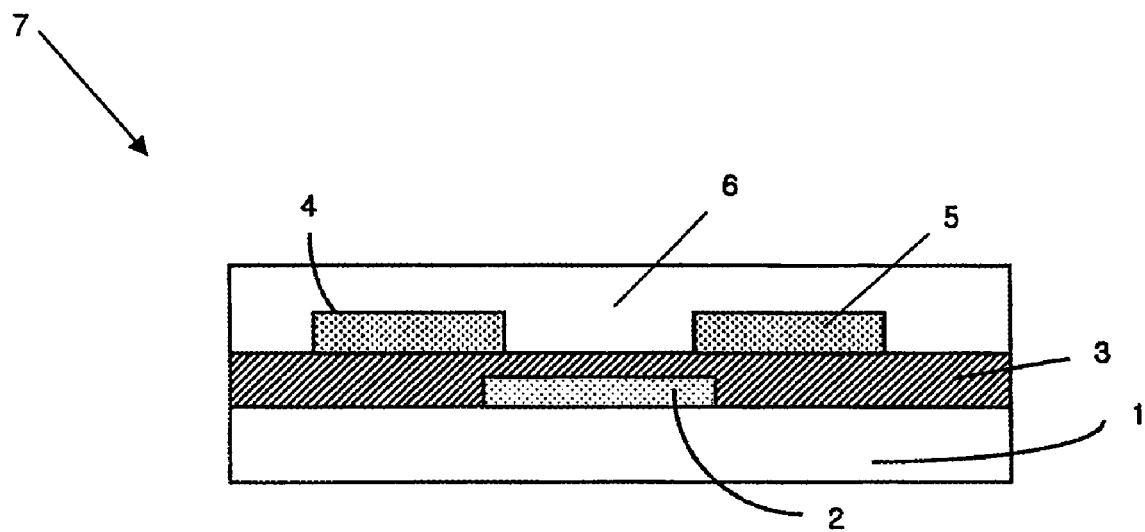
FIG. 1 is a cross-sectional view showing the structure of a device fabricated in Example 1.

Hereinafter, the present invention will be described in detail.

The oligothiophene-arylene derivative of the present invention is represented by Formula 1 below:

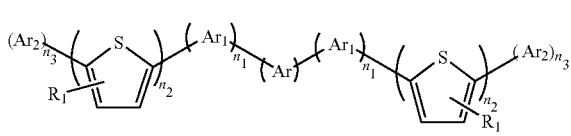

Formula 1 wherein

Ar is a $C_{2-30}$ heteroarylene interrupted by at least one nitrogen atom which may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

$Ar_1$ is a $C_{2-30}$ aryl group which may be interrupted by at least one heteroatom and may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

$Ar_2$ is a $C_{5-30}$ aryl group which may be interrupted by at least one heteroatom and may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

the substituents $R_1$, are each independently hydrogen, hydroxyl, amino, $C_{1-20}$ linear, branched or cyclic alkyl, $C_{1-20}$ alkoxyalkyl, alkylamino, ester, amido, or a $C_{1-16}$ linear, branched or cyclic alkoxy, alkylamino, ester or amido;

$n_2$ is an integer between 2 and 8; and $n_1$ and $n_3$ are each independently an integer between 0 and 6.

The oligothiophene-arylene derivative of embodiments of the present invention is synthesized from compounds of Formulae 2, 3, 4 and 5 below:

$$X_1\text{—}Ar\text{—}X_2 \quad \text{Formula 2}$$

wherein

Ar is as defined in Formula 1, and $X_1$ and $X_2$ are each independently Br, Cl, or I;

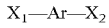

Formula 3 wherein $Ar_1$ is as defined in Formula 1, $X_3$ is a trialkyltin group, a dioxaborane group, boronic acid, or the like, and $n_1$ is an integer between 0 and 6;

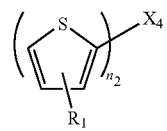

Formula 4 wherein $X_4$ is a trialkyltin group, a dioxaborane group, boronic acid, or the like, and $n_2$ is an integer between 2 and 8; and

Formula 5 wherein $Ar_2$ is as defined in Formula 1, $X_5$ is a trialkyltin group, a dioxaborane group, boronic acid, or the like, and $n_3$ is an integer between 0 and 6.

In the oligothiophene-arylene derivative of Formula 1 according to embodiments of the present invention, non-limiting representative examples of compounds corresponding to Ar include compounds represented by Formula 6 below:

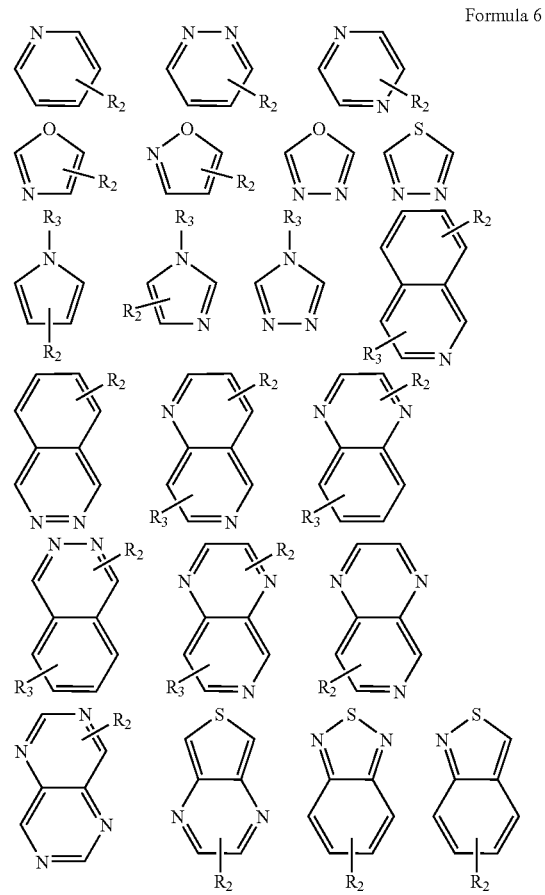

Formula 6

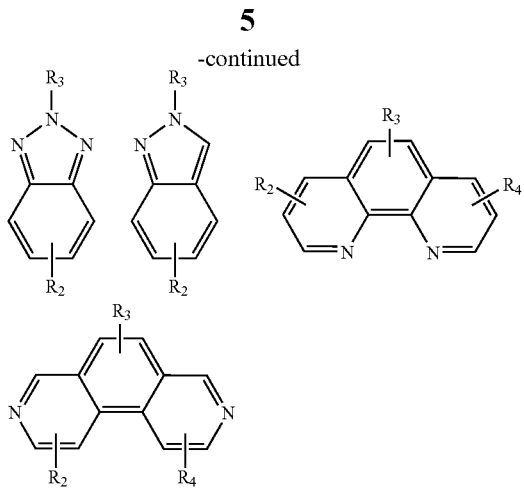

wherein
$R_2$, $R_3$ and $R_4$ are each independently hydrogen, hydroxyl, amino, $C_{1-20}$ linear, branched or cyclic alkyl, $C_{1-20}$ alkoxyalkyl, alkylamino, ester, amido, or $C_{1-16}$ linear, branched or cyclic alkoxy, alkylamino, ester or amido.

Specific examples of the compounds of Formula 6 include, but are not limited to, thiadiazoles, oxazoles, isoxazoles, oxadiazoles, imidazoles, pyrazoles, thiadiazoles, triazoles, tetrazoles, pyridines, pyridazines, pyrimidines, pyrazines, triazines, quinolines, isoquinolines, quinoxalines, naphthyridines, benzoimidazoles, pyrimidopyrimidines, benzothiadiazoles, benzoselenadiazoles, benzotriazoles, benzothiazoles, benzoxazoles, phenanthrolines, phenazines, and phenanthridines.

In the oligothiophene-arylene derivative of Formula 1 according to embodiments of the present invention, non-limiting representative examples of compounds corresponding to $Ar_1$ include compounds represented by Formula 7 below:

Formula 7

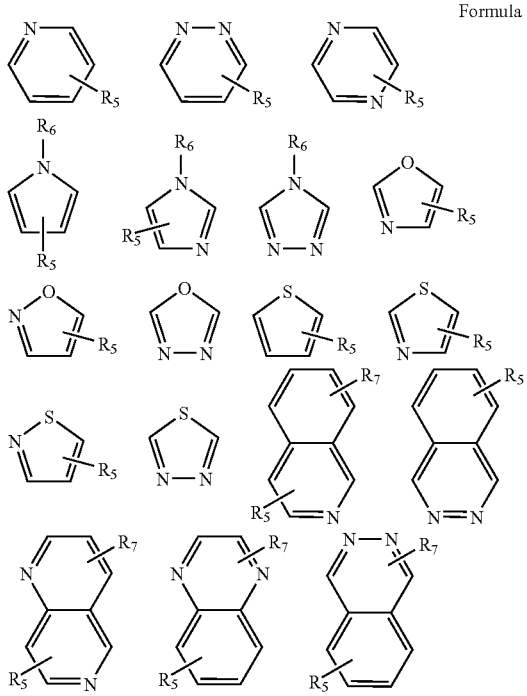

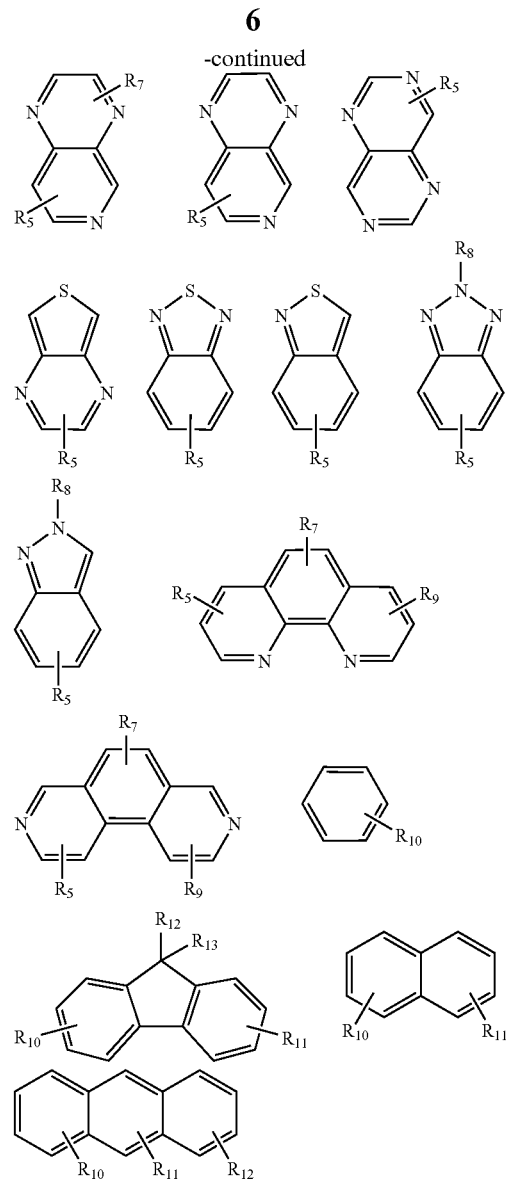

wherein
$R_5$, $R_6$, $R_7$, $R_8$, $R_9$, $R_9$, $R_{10}$, $R_{11}$, $R_{12}$ and $R_{13}$ are each independently hydrogen, hydroxyl, amino, $C_{1-20}$ linear, branched or cyclic alkyl, $C_{1-20}$ alkoxyalkyl, alkylamino, ester, amido, or $C_{1-16}$ linear, branched or cyclic alkoxy, alkylamino, ester or amido.

Specific examples of the compounds of Formula 7 include, but are not limited to, thiophenes, thiazoles, thiadiazoles, oxazoles, isoxazoles, oxadiazoles, imidazoles, pyrazoles, thiadiazoles, triazoles, tetrazoles, pyridines, pyridazines, pyrimidines, pyrazines, triazines, quinolines, isoquinolines, quinoxalines, naphthyridines, benzoimidazoles, pyrimidopyrimidines, benzothiadiazoles, benzoselenadiazoles, benzotriazoles, benzothiazoles, benzoxazoles, phenanthrolines, phenazines, phenanthridines, benzenes, naphthalenes, and fluorenes.

In the oligothiophene-arylene derivative of Formula 1 according to embodiments of the present invention, non-limiting representative examples of compounds corresponding to $Ar_2$ include compounds represented by Formula 8 below:

Formula 8

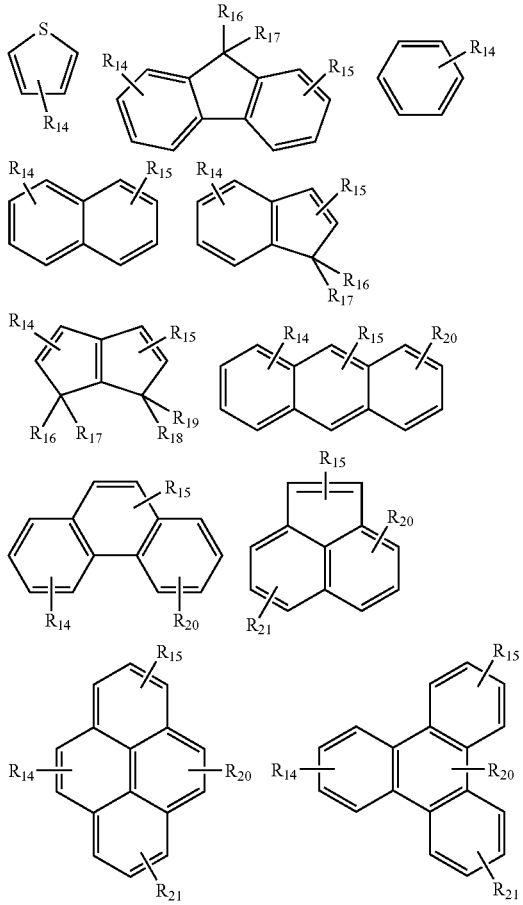

wherein $R_{14}$, $R_{15}$, $R_{16}$, $R_{17}$, $R_{18}$, $R_{19}$, $R_{20}$ and $R_{21}$ are each independently hydrogen, hydroxyl, amino, $C_{1-20}$ linear, branched or cyclic alkyl, $C_{1-20}$ alkoxyalkyl, alkylamino, ester, amido, or $C_{1-16}$ linear, branched or cyclic alkoxy, alkylamino, ester or amido.

Specific examples of the compounds of Formula 8 include, but are not limited to, $C_{5-30}$ aromatic compounds, for example, benzenes, naphthalenes, anthracenes, and fluorenes.

The oligothiophene-arylene derivative of embodiments of the present invention can be synthesized by chemical or electrochemical oxidation and condensation using an organometallic compound of a transition metal, such as nickel or palladium. More preferably, the oligothiophene-arylene derivative of embodiments of the present invention can be synthesized by condensation using a palladium (0) compound of Formula 9, or a palladium (II) compound of Formula 10 or 11 below:

$$Pd(L)_4 \qquad \text{Formula 9}$$

wherein L is a ligand selected from the group consisting of triphenylphosphine ($PPh_3$), triphenylarsine ($AsPh_3$), triphenylphosphite ($P(OPh)_3$), diphenylphosphinoferrocene (dppf), diphenylphosphino butane (dppb), acetate (OAc), and dibenzylideneacetone (dba);

$$Pd(L)_2(X)_2 \qquad \text{Formula 10}$$

wherein L is as defined in Formula 9, and X is I, Br or Cl; or $$Pd(L)_2 \qquad \text{Formula 11}$$

wherein L is as defined in Formula 9.

The condensation is carried out through the reaction paths depicted by the following Reaction Scheme 1:

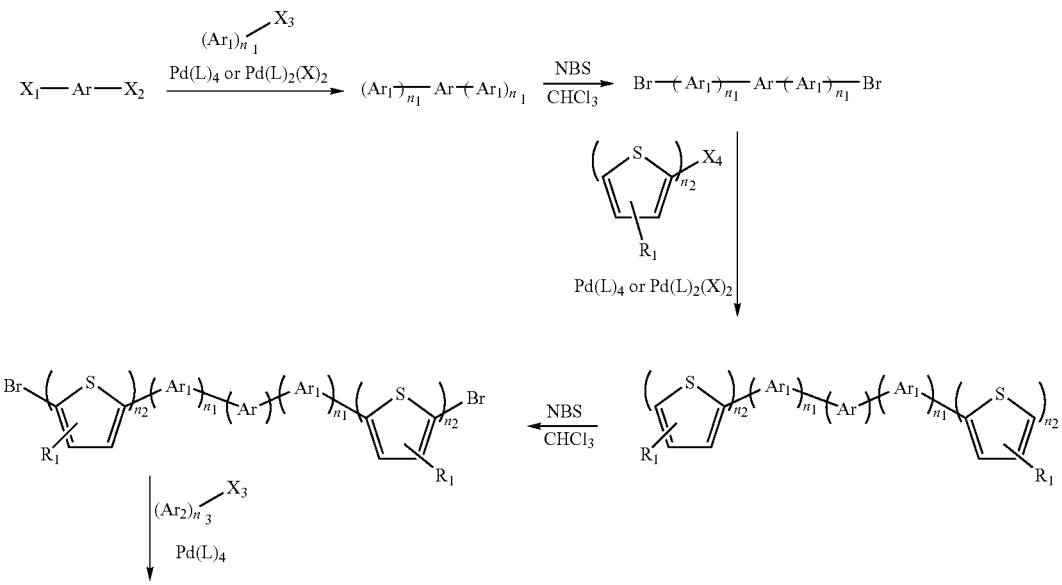

Reaction Scheme 1

-continued

Specifically, the condensation is carried out under a nitrogen atmosphere at 70-130° C. for 2-24 hours by the Suzuki coupling reaction generally known in the art. At this time, toluene, dimethoxy ether, tetrahydrofuran, dimethylformamide, water, etc., can be used as a solvent.

Non-limiting, representative examples of oligothiophene-arylene derivatives that can be synthesized by the Suzuki coupling reaction include compounds 1, 2, 3, 4, and 5 of Formula 12 below:

Formula 12

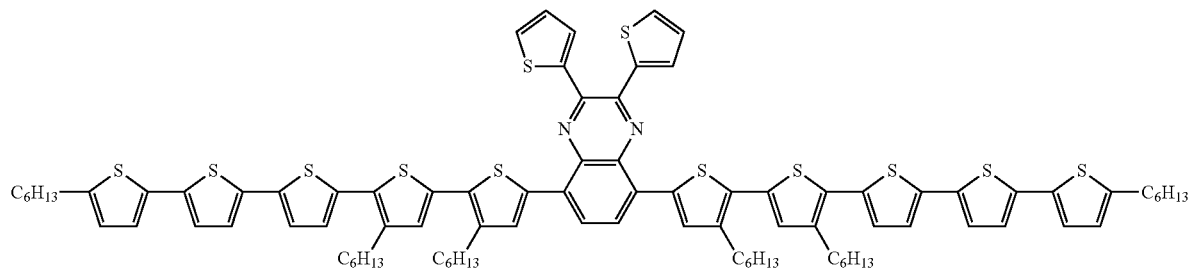

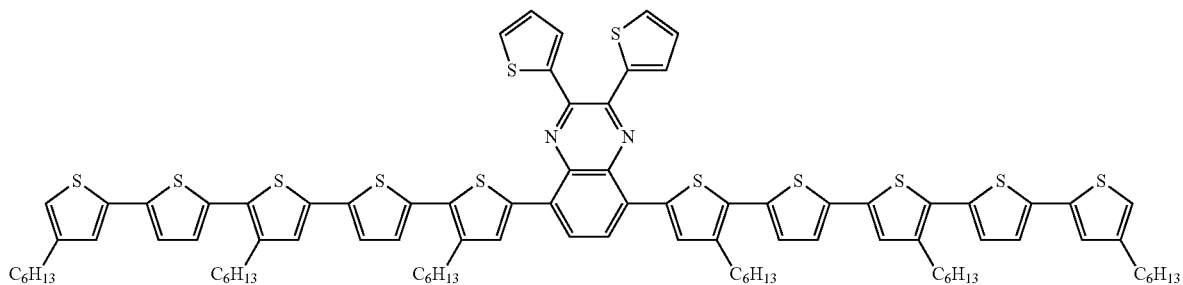

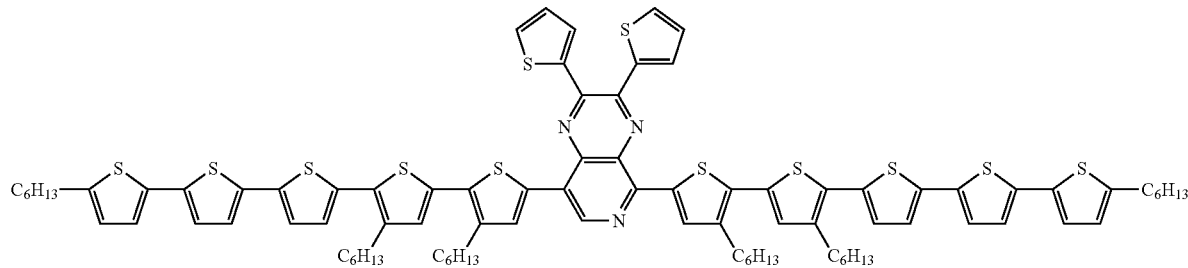

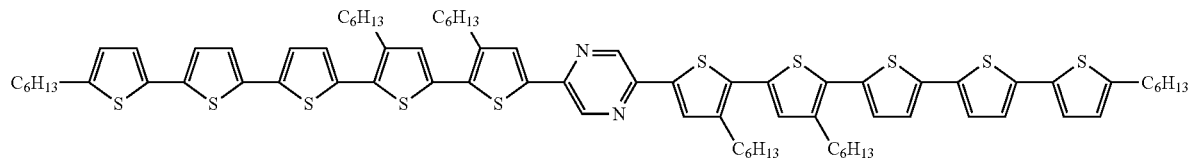

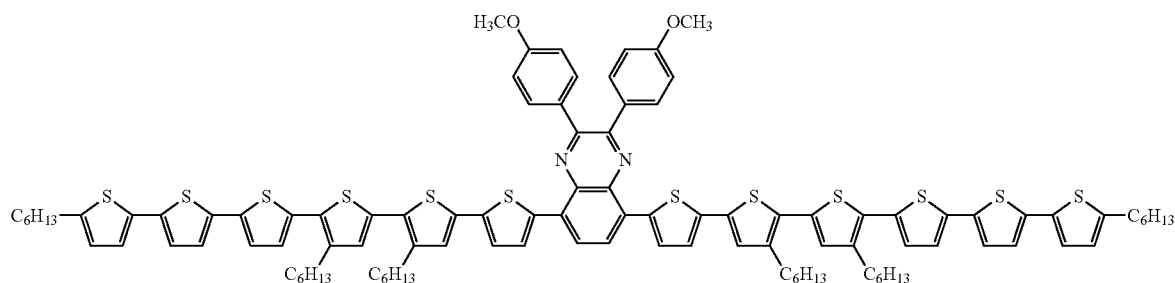

To synthesize the oligothiophene-arylene derivatives of Formula 12, dihalide-substituted arylene derivatives (e.g., the compound of Formula 2) and boron-substituted compounds (e.g., the compounds of Formulae 3 to 5) are necessary. Compounds that are actually used to prepare the oligothiophene-arylene derivatives of Formula 12 in the present invention are the compounds 6, 7, 8 and 9 represented by Formula 13 and the compounds 10, 11, 12 and 13 of Formula 14 below:

Formula 13

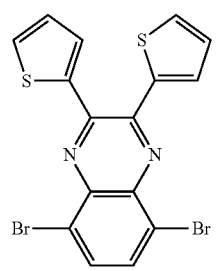
6

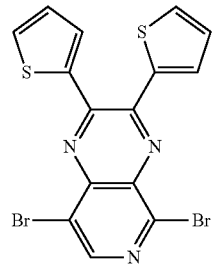
7

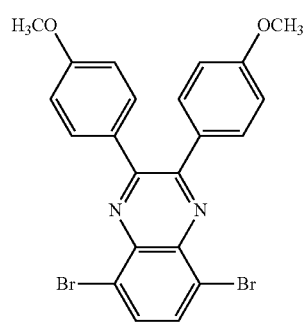
8

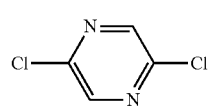
9

Formula 14

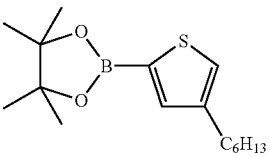
10

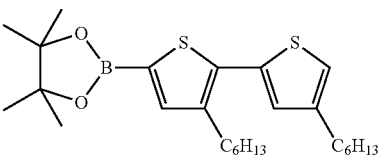
11

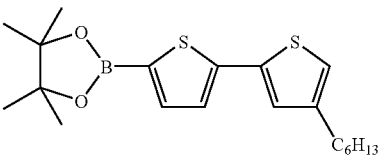
12

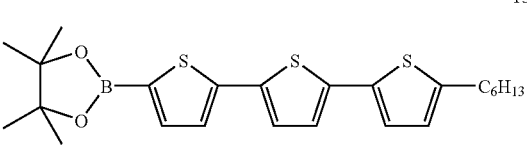
13

The oligothiophene-arylene derivative of embodiments of the present invention can be used as a novel organic semiconductor material for an active layer of an OTFT. General organic thin film transistors have structures of a substrate/a gate electrode/a gate insulating layer/an organic active layer/source-drain electrodes, a substrate/a gate electrode/a gate insulating layer/source-drain electrodes/an organic active layer, and the like, but are not limited to these structures.

At this time, the oligothiophene-arylene derivative of embodiments of the present invention can be formed into a thin film by screen printing, printing, spin coating, dipping, or ink spraying.

The gate insulating layer constituting the OTFT can be made of common insulators having a high dielectric constant. Specific examples of suitable insulators include, but are not limited to, ferroelectric insulators, e.g., $Ba_{0.33}Sr_{0.66}TiO_3$ (BST), $Al_2O_3$, $Ta_2O_5$, $La_2O_5$, $Y_2O_3$, and $TiO_2$; inorganic insulators, e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, and AlON; and organic insulators, e.g., polyimides, benzocyclobutenes (BCBs), parylenes, polyacrylates, polyvinylalcohols, polyvinylphenols, and the like.

The substrate constituting the organic thin film transistor can be made of, but is not limited to, glass, polyethylenenaphthalate (PEN), polyethyleneterephthalate (PET), polycarbonate, polyvinylalcohol, polyacrylate, polyimide, polynorbornene, polyethersulfone (PES), and the like.

The gate electrode constituting the organic thin film transistor can be made of common metals. Specific examples of such metals include, but are not limited to, gold (Au), silver (Ag), aluminum (Al), nickel (Ni), indium tin oxide (ITO), and the like.

The source and drain electrodes constituting the organic thin film transistor can be made of common metals. Specific examples of such metals include, but are not limited to, gold (Au), silver (Ag), aluminum (Al), nickel (Ni), indium tin oxide (ITO), and the like.

Embodiments of the present invention will now be described in more detail with reference to the following examples. However, these examples are given for the purpose of illustration and are not to be construed as limiting the scope of the invention.

Preparative Example 1

Preparation of Arylene 6

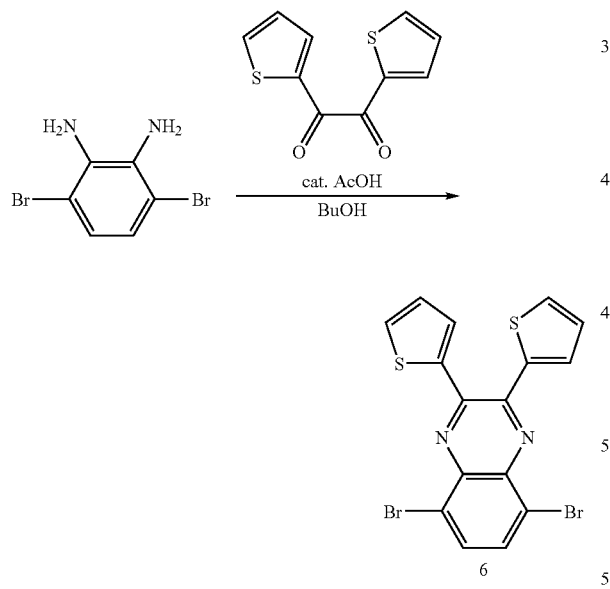

A catalytic amount of acetic acid was added to 1,2-diamino-3,6-dibromobenzene and 2,2'-thenil in butanol. The mixture was heated to 110° C. for 8 hours. The resulting mixture was allowed to cool to room temperature, and filtered with washing (methanol), affording the arylene 6 as a red solid.

$^{1}$H-NMR (300 MHz, CDCl$_{3}$) δ (ppm) 7.04 (t, 2H, J=5.0 Hz), 7.48 (d, 2H, J=5.0 Hz), 7.55 (d, 2H, J=5.0 Hz), 7.82 (s, 2H).

Preparative Example 2

Preparation of Arylene 7

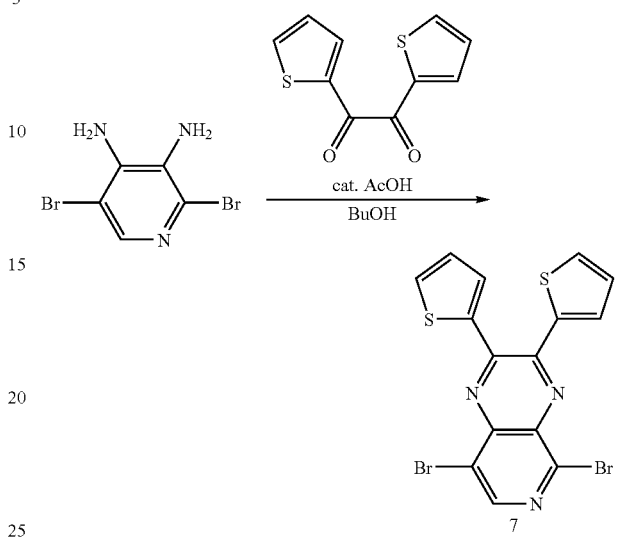

A catalytic amount of acetic acid was added to 3,4-diamino-2,6-dibromopyridine and 2,2'-thenil in butanol. The mixture was heated to 110° C. for 8 hours. The resulting mixture was allowed to cool to room temperature, and filtered with washing (methanol), affording the arylene 7 as an ocher solid.

$^{1}$H-NMR (300 MHz, CDCl$_{3}$) δ (ppm) 7.06-7.10 (m, 2H), 7.56 (d, 1H, J=3.8 Hz), 7.56-7.66 (m, 3H), 8.67 (s, 1H).

Preparative Example 3

Preparation of Arylene 8

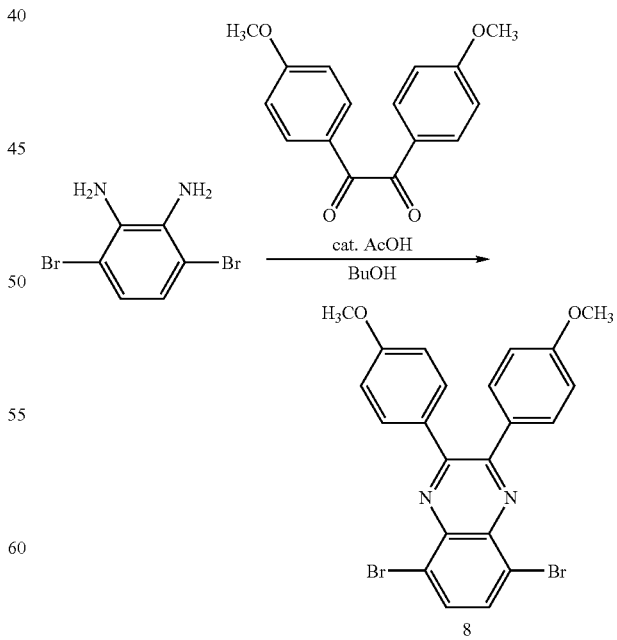

A catalytic amount of acetic acid was added to 1,2-diamino-3,6-dibromobenzene and 4,4'-dimethoxybenzyl in butanol. The mixture was heated to 110° C. for 8 hours. The resulting mixture was allowed to cool to room temperature, and filtered with washing (methanol), affording the arylene 8 as a red solid.

¹H-NMR (300 MHz, CDCl₃) δ (ppm) 3.85 (s, 6H), 6.90 (d, 2H, J=8.7 Hz), 7.66 (d, 2H, J=8.7 Hz), 7.93 (s, 2H).

Preparative Example 4

Preparation of Oligothiophene Borolanes 10 and 11

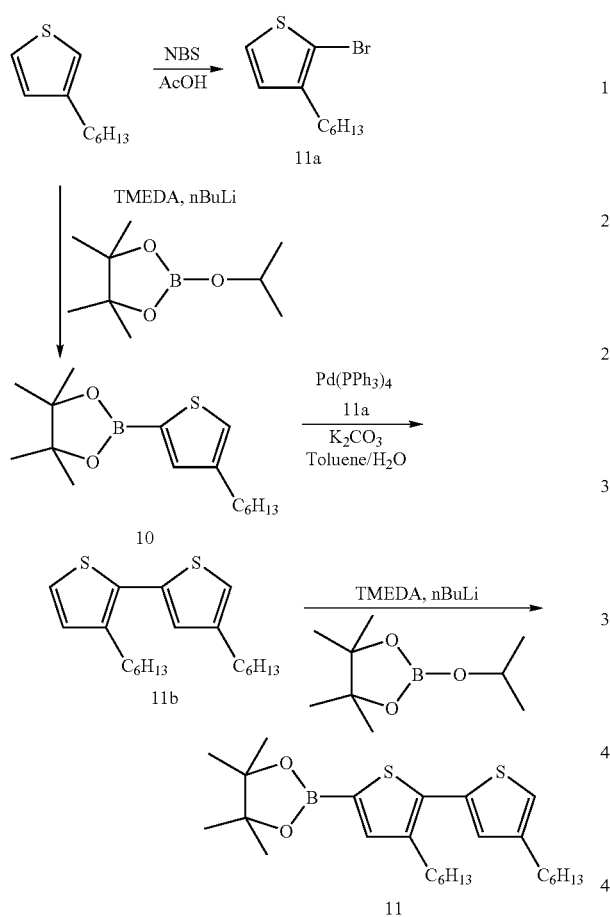

3-Hexyl thiophene was reacted with N-bromosuccinimide (NBS) in acetic acid to obtain the compound 11a. Separately, n-BuLi was added to 3-hexyl thiophene in tetrahydrofuran (THF) at −20° C., and then N,N,N',N'-tetramethylethylenediamine (TMEDA) was added thereto. The mixture was heated to 70° C. for 3 hours. Subsequently, dioxaborolane was added to the mixture at −78° C. and was slowly allowed to warm to room temperature to obtain the oligothiophene 10.

The compounds 11a and 10 were added to a mixture of toluene and water, and then tetrakis(triphenylphosphine)palladium (0) (Pd(PPh₃)₄, Aldrich) as a catalyst and potassium carbonate were added thereto. The reaction mixture was allowed to react at 110° C. for 8 hours to obtain the compound 11b.

n-BuLi in tetrahydrofuran was added to the compound 11b at −20° C., and then N,N,N',N'-tetramethylethylenediamine (TMEDA) was added thereto. The mixture was heated to 70° C. for 3 hours. Subsequently, dioxaborolane was added to the mixture at −78° C. and was slowly allowed to warm to room temperature to afford the oligothiophene borolane 11.

¹H-NMR (300 MHz, CDCl₃) δ (ppm) 0.86-0.89 (m, 6H), 1.25-1.34 (m, 24H), 1.58-1.63 (m, 4H), 2.60 (t, 2H, J=7.6 Hz), 2.74 (t, 2H, J=7.9 Hz), 6.90 (s, 1H), 6.99 (s, 1H), 7.44 (s, 1H).

Preparative Example 5

Preparation of Oligothiophene Borolane 12

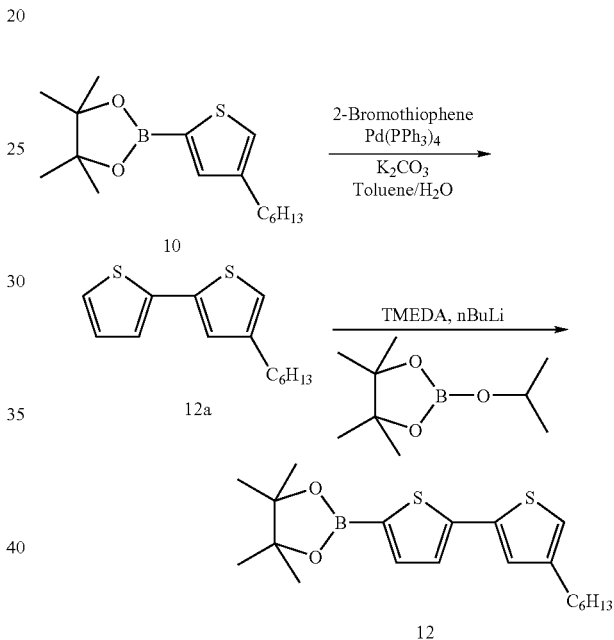

The oligothiophene borolane 12 was prepared in the same manner as in Preparative Example 4, except that 2-bromothiophene was used instead of the compound 11a.

¹H-NMR (300 MHz, CDCl₃) δ (ppm) 0.89 (t, 3H, J=6.8 Hz), 1.21-1.35 (m, 18H), 1.59-1.66 (m, 2H), 2.58 (t, 2H, J=7.8 Hz), 6.68 (s, 1H), 7.00 (s, 1H), 7.20 (d, 1H, J=3.5 Hz), 7.47 (d, 1H, J=3.5 Hz).

Preparative Example 6

Preparation of Oligothiophene Borolane 13

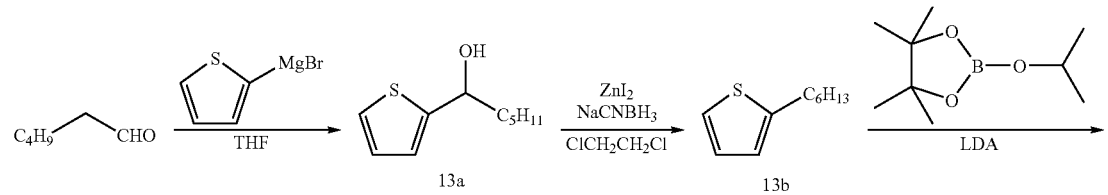

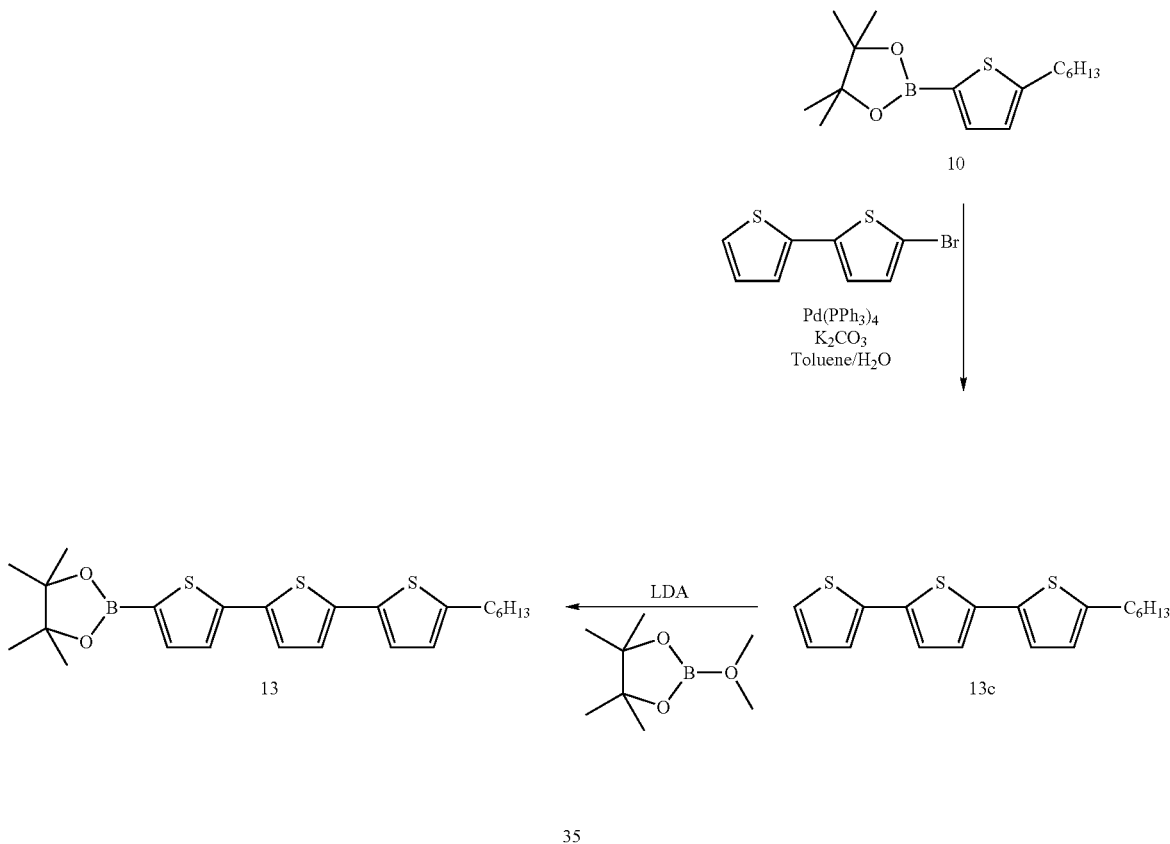

Thiophen-2-yl-magnesium bromide was added to a mixture of hexanal and THF to obtain the compound 13a. Zinc iodide, sodium cyanoborohydride and 1,2-dichloroethane were added to the compound 13a, and then the mixture was heated to 85° C. for 3 hours to obtain the compound 13b. Lithium diisopropylamide (LDA) in THF was added to the compound 13b at −78° C., and then dioxaborolane was added thereto to obtain the thiophene borolane 10. Thereafter, the thiophene borolane 10 and 2-bromobithiophene were subjected to the Suzuki coupling reaction under the same conditions indicated in Preparative Example 1 to obtain the compound 13c.

Lithium diisopropylamide (LDA) in THF was added to the compound 13c at −78° C., and then dioxaborolane was added thereto to afford the oligothiophene borolane 13.

$^1$H-NMR (300 MHz, CDCl$_3$) δ (ppm) 0.89 (t, 3H, J=6.8 Hz), 1.25-1.43 (m, 18H), 1.57-1.88 (m, 2H), 2.79 (t, 2H, J=7.5 Hz), 6.68 (d, 2H, J=3.5 Hz), 6.97-7.00 (m, 2H), 7.05 (d, 1H, J=3.5 Hz), 7.21 (d, 1H, J=3.5 Hz), 7.52 (d, 1H, J=3.5 Hz).

Preparative Example 7

Preparation of Oligothiophene-Arylene Derivative 1

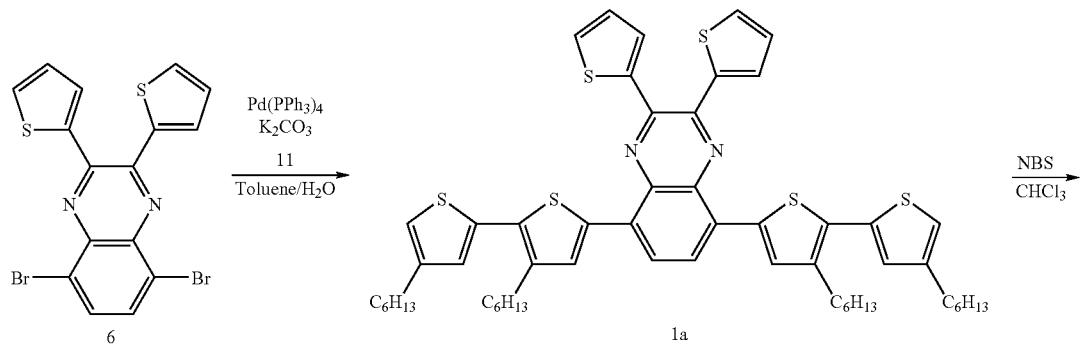

-continued

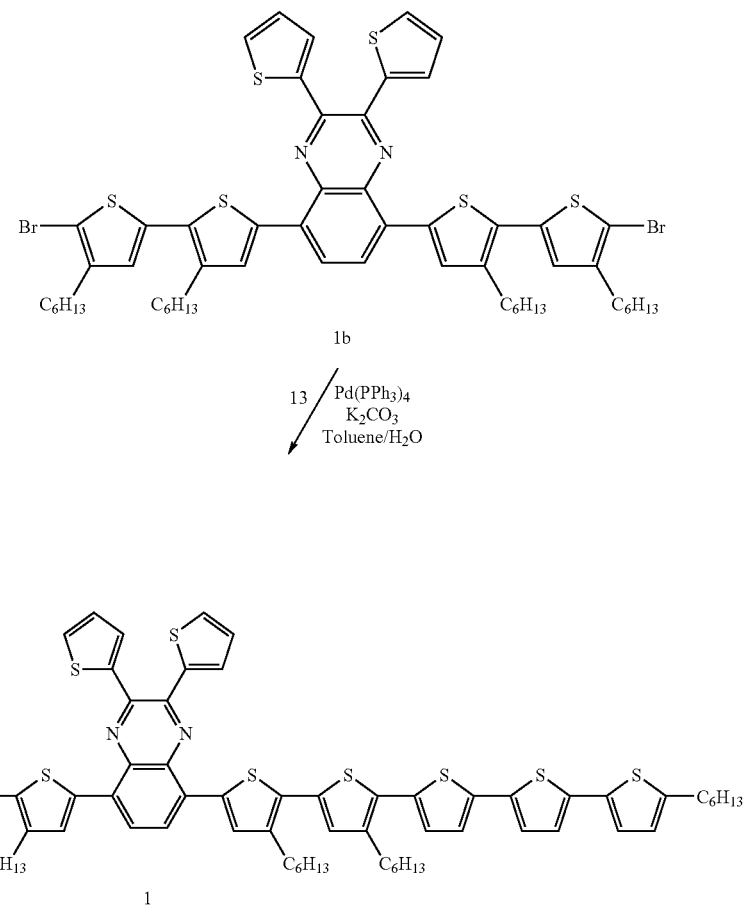

The arylene 6 and the oligothiophene borolane 11 were subjected to condensation by the Suzuki coupling reaction to obtain the compound 1a. To the compound 1a was added N-bromosuccinimide to obtain the dibromide 1b. The dibromide 1b and the oligothiophene borolane 13 were mixed with toluene and water, and then Pd(PPh$_3$)$_4$, as a catalyst, and potassium carbonate in a solvent were added thereto. The resulting mixture was heated to 110° C. for 8 hours and washed with an aqueous ammonium chloride solution. The obtained organic layer was distilled under reduced pressure and purified by silica gel column chromatography to afford the oligothiophene-arylene derivative 1.

Figure 2:
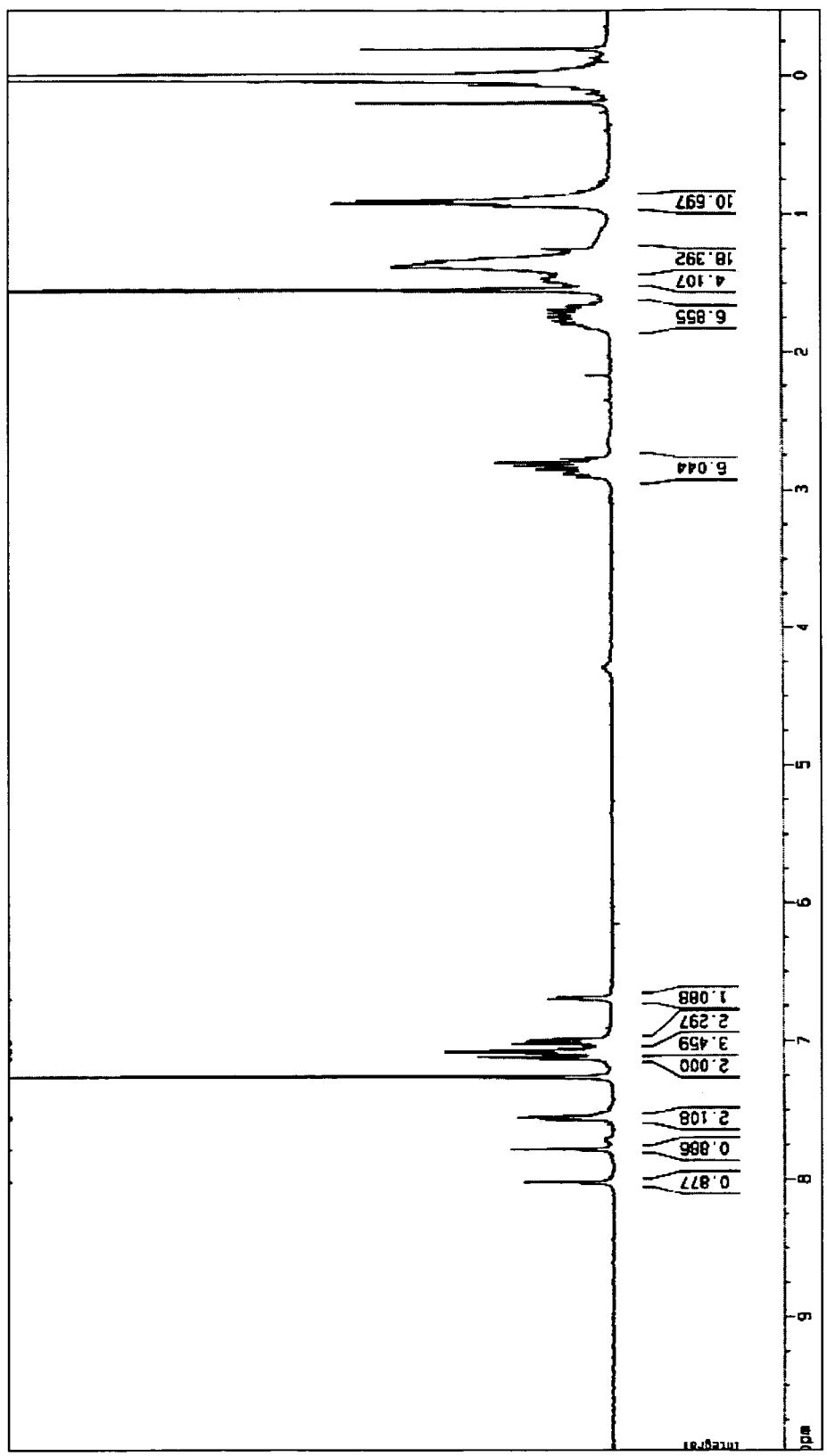
FIG. 2 is a $^1$H-NMR spectrum of an oligothiophene-arylene derivative prepared in Preparative Example 7.

$^1$H-NMR (300 MHz, CDCl$_3$) δ (ppm) 0.87-0.94 (m, 18H), 1.26-1.54 (m, 36H), 1.65-1.90 (m, 12H), 2.78-2.91 (m, 12H), 6.69 (d, 2H, J=3.5 Hz), 7.00 (d, 2H, J=3.5 Hz), 7.02 (d, 2H, J=3.5 Hz), 7.05-7.14 (m, 10H), 7.55-7.57 (m, 4H), 7.78 (s, 2H), 8.02 (s, 2H). The $^1$H-NMR spectra is illustrated in FIG. 2.

Preparative Example 8

Preparation of Oligothiophene-Arylene Derivative 2

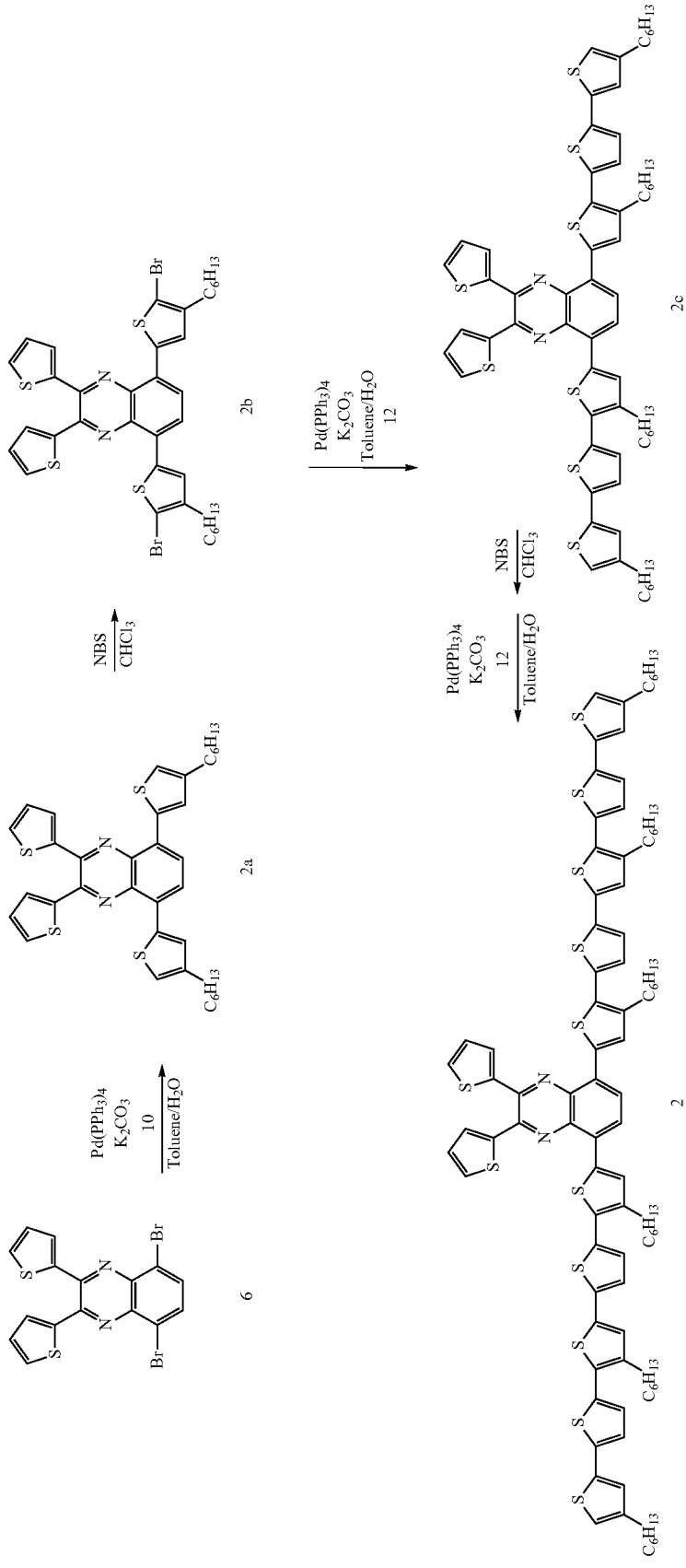

The oligothiophene-arylene derivative 2 was prepared in the same manner as in Preparative Example 7, except that the compounds 10 and 12 were used instead of the oligothiophene borolanes 11 and 13.

$^1$H-NMR (300 MHz, CDCl$_3$) δ (ppm) 0.90-0.93 (m, 18H), 1.30-1.48 (m, 36H), 1.62-1.79 (m, 12H), 2.60 (t, 4H, J=7.7 Hz), 2.78 (t, 4H, J=7.7 Hz), 2.88 (t, 4H, J=7.7 Hz), 6.82 (s, 2H), 7.03-7.08 (m, 8H), 7.10 (d, 2H, J=3.7 Hz), 7.15 (s, 4H) 7.53 (d, 2H, J=3.7 Hz), 7.58 (d, 2H, J=3.7 Hz), 7.76 (s, 2H), 8.00 (s, 2H).

Preparative Example 9

Preparation of Oligothiophene-Arylene Derivative 3

The arylene 7 and the oligothiophene borolane 11 were subjected to condensation by the Suzuki coupling reaction to obtain the compound 3a. To the compound 3a was added N-bromosuccinimide to obtain the dibromide 3b. The dibromide 3 b and the oligothiophene borolane 13 were mixed with toluene and water, and then Pd(PPh$_3$)$_4$ as a catalyst and potassium carbonate in a solvent were added thereto. The resulting mixture was heated to 110° C. for 8 hours and washed with an aqueous ammonium chloride solution. The obtained organic layer was distilled under reduced pressure and purified by silica gel column chromatography to afford the oligothiophene-arylene derivative 3.

$^1$H-NMR (300 MHz, CDCl$_3$) δ (ppm) 0.88-0.95 (m, 18H), 1.25-1.55 (m, 36H), 1.66-1.88 (m, 12H), 2.78-2.98 (m, 12H), 6.68 (d, 2H, J=3.5 Hz), 6.98-7.00 (m, 4H), 7.04-7.10 (m, 9H), 7.14 (s, 1H), 7.26-7.62 (m, 4H), 7.76 (s, 1H), 8.47 (s, 1H), 8.96 (s, 1H).

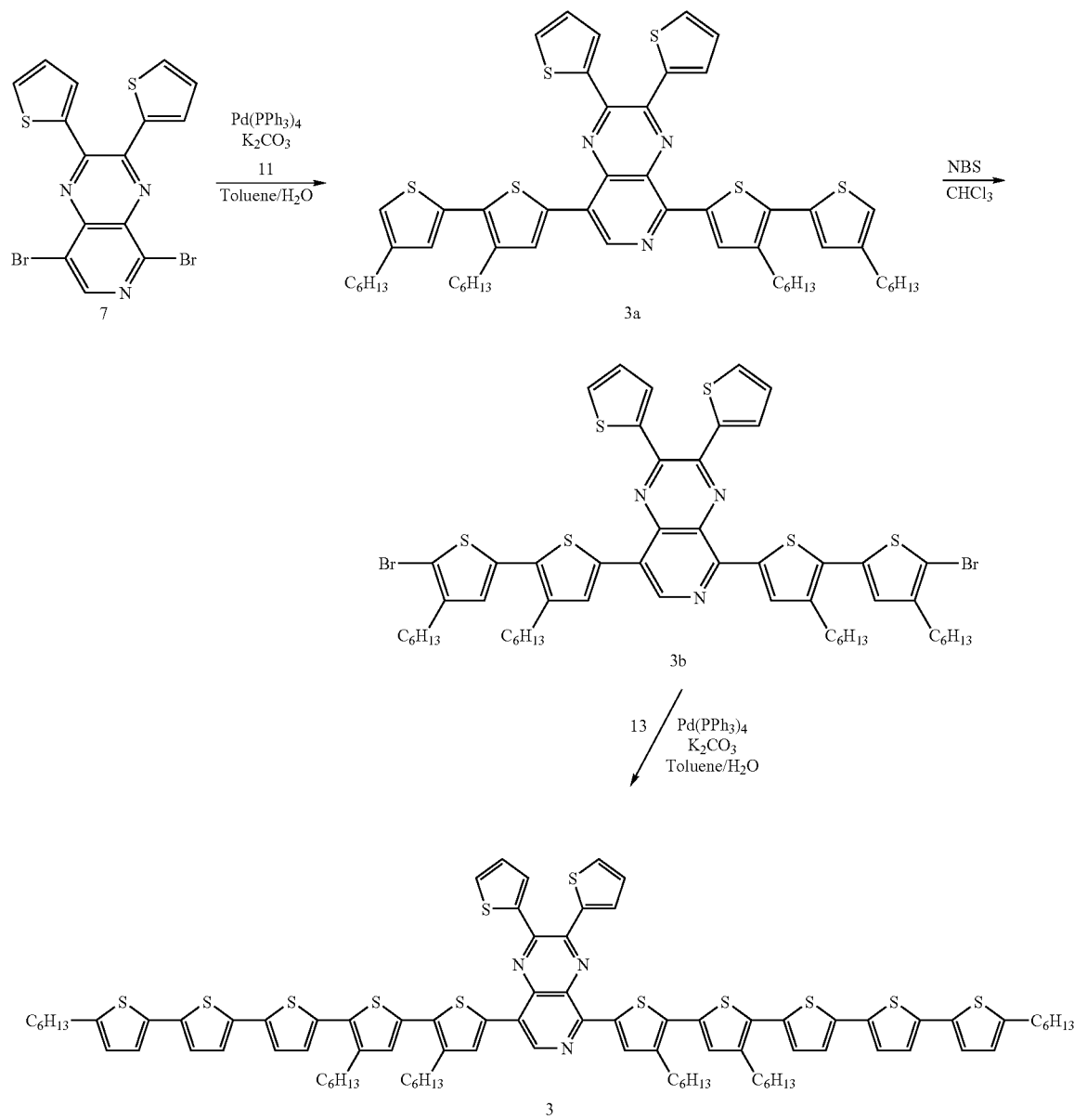

Preparative Example 10

Preparation of Oligothiophene-Arylene Derivative 4

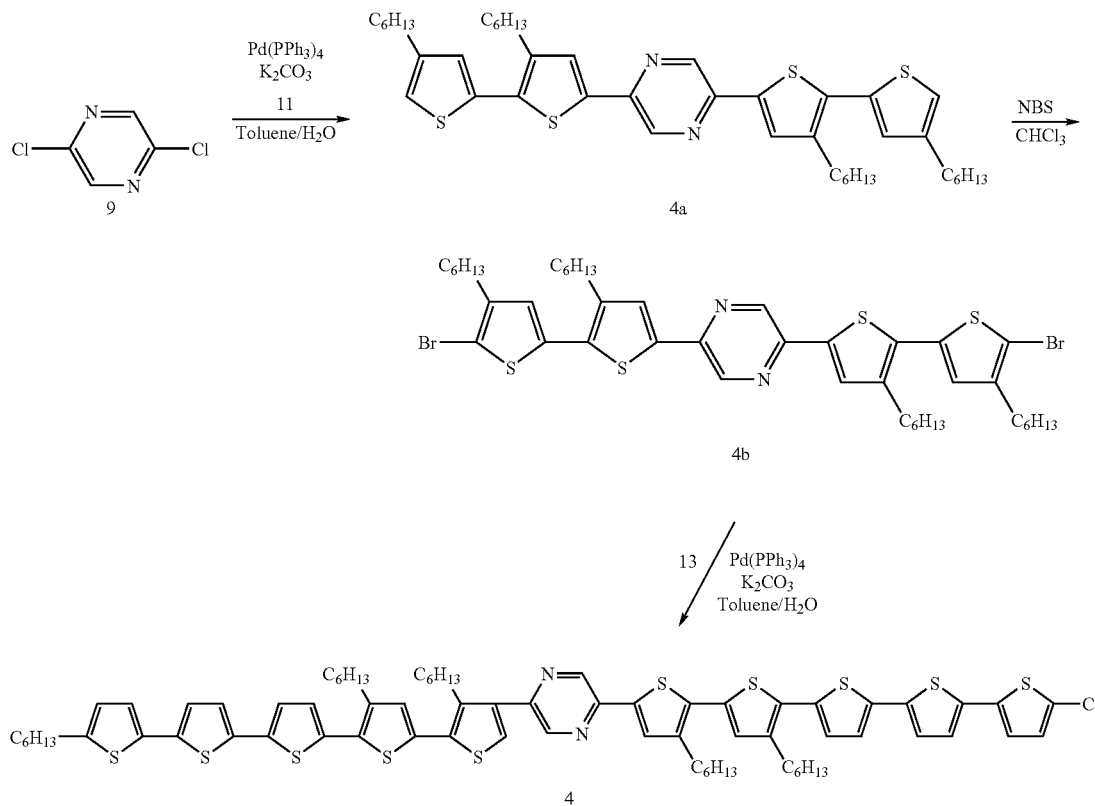

The oligothiophene-arylene derivative 4 was prepared in the same manner as in Preparative Example 7, except that the arylene 9 was used instead of the arylene 6.

$^1$H-NMR (300 MHz, CDCl$_3$) δ (ppm) 0.89-0.93 (m, 18H), 1.30-1.43 (m, 36H), 1.68-1.82 (m, 12H), 2.77-2.87 (m, 12H), 6.69 (d, 2H, J=3.5 Hz), 6.99-7.02 (m, 4H), 7.06-7.09 (m, 6H), 7.12 (d, 2H, J=3.5 Hz), 7.49 (s, 2H), 8.81 (s, 2H).

Preparative Example 11

Preparation of Oligothiophene-Arylene Derivative 5

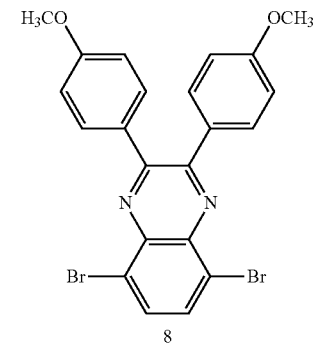

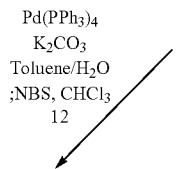

-continued

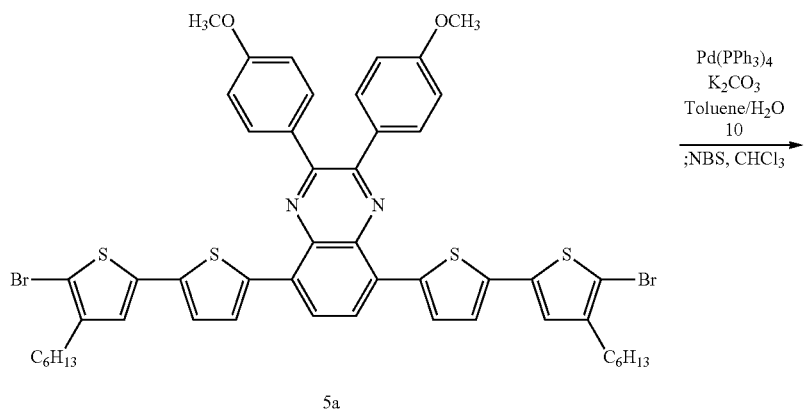

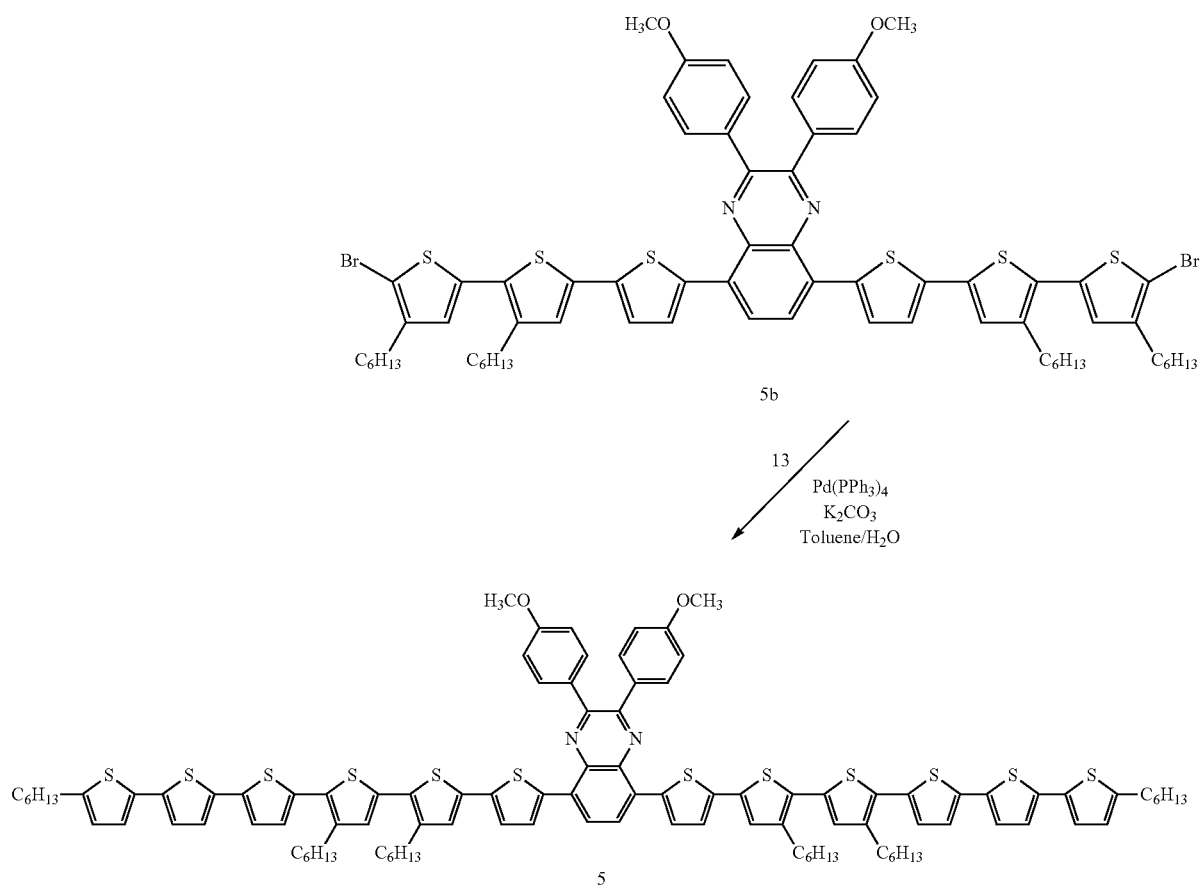

The oligothiophene-arylene derivative 5 was prepared in the same manner as in Preparative Example 7, except that the arylene 8 was used instead of the arylene 6 and that the thiophene borolanes 10 and 12 were used instead of the thiophene borolane 11.

Figure 3:
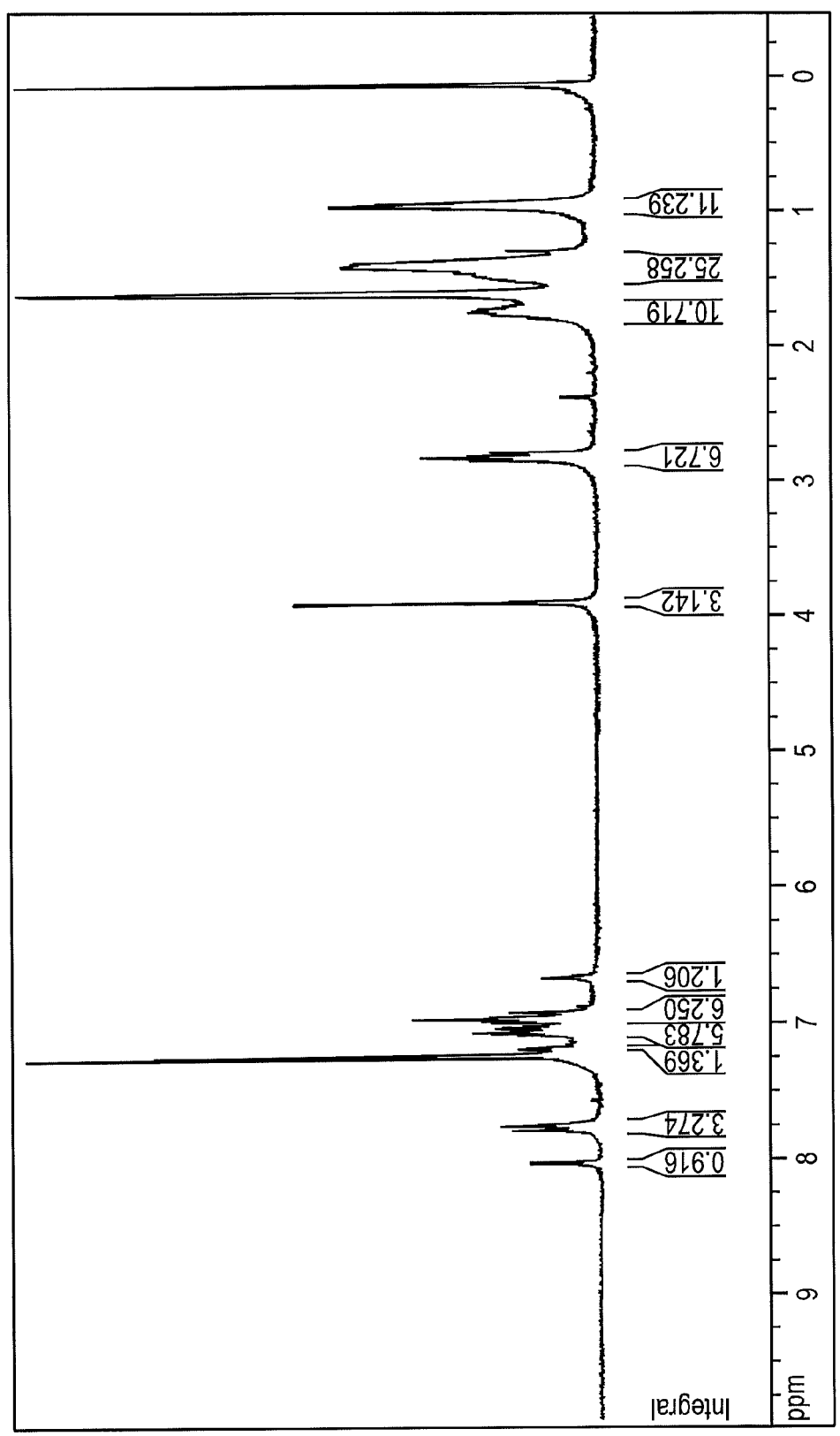
FIG. 3 is a $^1$H-NMR spectrum of an oligothiophene-arylene derivative prepared in Preparative Example 11.

$^1$H-NMR (300 MHz, CDCl$_3$) δ (ppm) 0.89-0.93 (m, 18H), 1.26-1.43 (m, 36H), 1.64-1.88 (m, 12H), 2.80 (t, 12H, J=7.9 Hz), 3.88 (s, 6H), 6.69 (d, 2H, J=3.5 Hz), 6.95-7.12 (m, 10H), 7.22 (d, 2H, J=3.5 Hz), 7.77-7.82 (m, 6H), 8.07 (s, 2H). The $^1$H-NMR spectra is illustrated in FIG. 3.

Fabrication of OTFTs

Example 1

Fabrication of Organic Thin Film Transistor Using Oligothiophene-Arylene Derivative 1

As schematically illustrated in FIG. 1, first, chromium was deposited on a plastic substrate 1 that had been previously washed by a sputtering process to form a gate electrode 2 having a thickness of 1,000 Å, and then SiO$_2$ was deposited on the gate electrode 2 by a CVD process to form a gate insulating film 3 having a thickness of 1,000 Å. ITO as a material for source-drain electrodes 4, 5 was deposited on the gate insulating layer to a thickness of 1,200 Å by a sputtering process. The resulting structure was washed with isopropyl alcohol for 10 minutes, dried, dipped in a 1 mM octadecyltrichlorosilane solution in hexane for 30 seconds, washed with acetone, and dried. Separately, the oligothiophene-arylene derivative, compound 1, prepared in Preparative Example 7 was dissolved in toluene to obtain a solution having a concentration of 2 wt %. The solution was applied to the dried structure at 1,000 rpm to a thickness of 700 Å, and baked under an argon atmosphere at 100° C. for 1 hour to form an organic active layer 6 and fabricate an OTFT 7.

Figure 4:
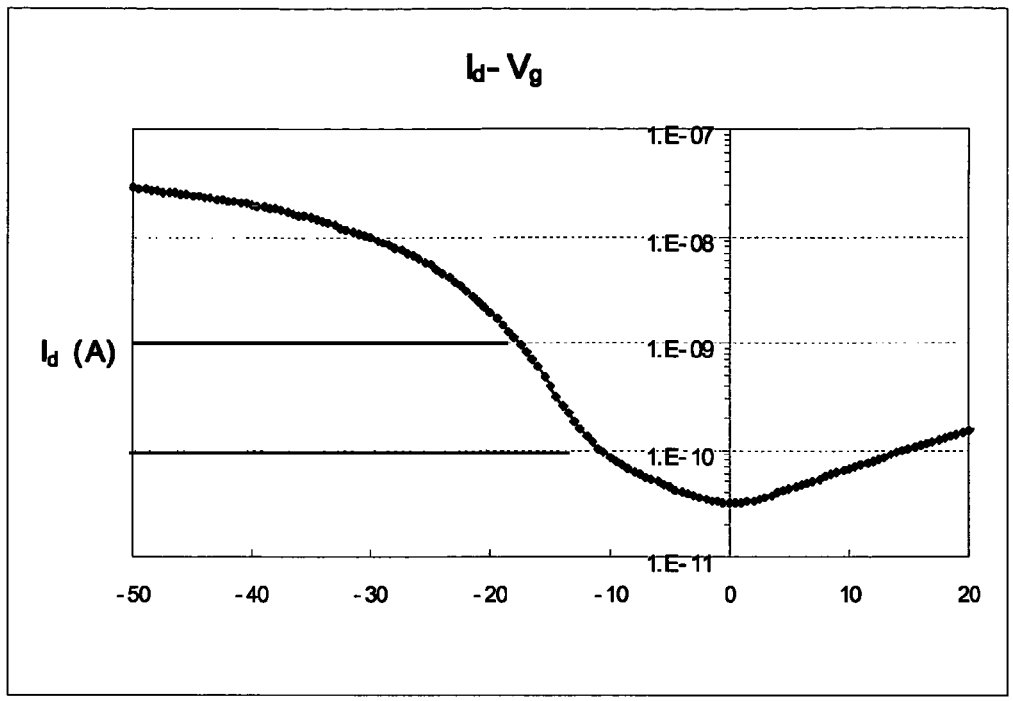
FIG. 4 is a graph showing the current transfer characteristics of an organic thin film transistor fabricated in Example 1 using an oligothiophene-arylene derivative prepared in Preparative Example 7.

The current transfer characteristics of the organic thin film transistor fabricated in Example 1 using an oligothiophene-arylene derivative prepared in Preparative Example 7 are graphically shown in FIG. 4.

Example 2

An organic thin film transistor was fabricated in the same manner as in Example 1, except that the oligothiophene-arylene derivative 2 prepared in Preparative Example 8 was used. The driving characteristics of the transistor were measured.

Example 3

An organic thin film transistor was fabricated in the same manner as in Example 1, except that the oligothiophene-arylene derivative 3 prepared in Preparative Example 9 was used. The driving characteristics of the transistor were measured.

Example 4

An organic thin film transistor was fabricated in the same manner as in Example 1, except that the oligothiophene-arylene derivative 4 prepared in Preparative Example 10 was used. The driving characteristics of the transistor were measured.

Example 5

An organic thin film transistor was fabricated in the same manner as in Example 1, except that the oligothiophene-arylene derivative 5 prepared in Preparative Example 11 was used. The driving characteristics of the transistor were measured.

Figure 5:
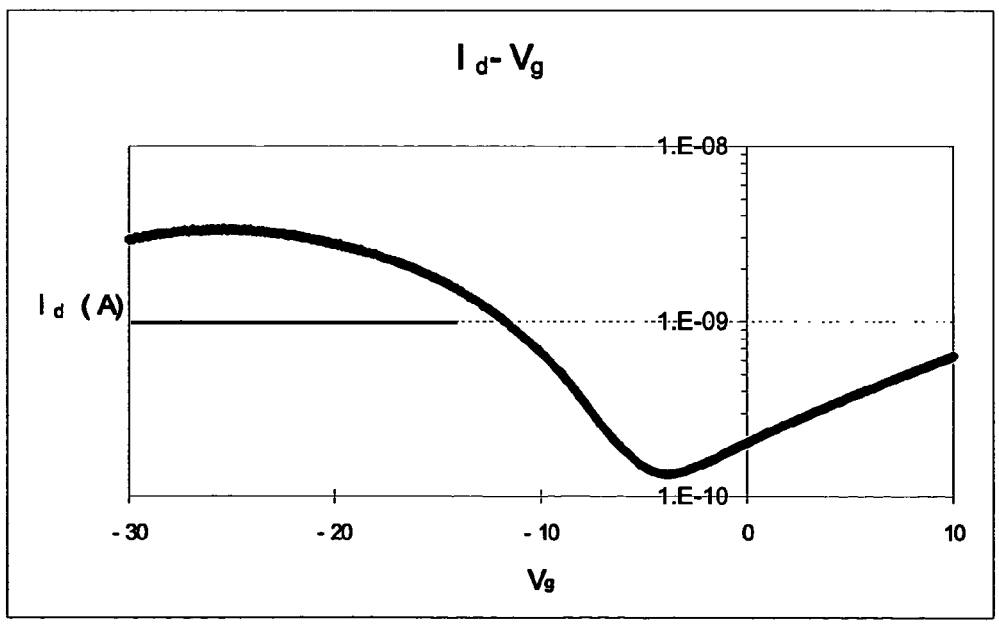
FIG. 5 is a graph showing the current transfer characteristics of an organic thin film transistor fabricated in Example 5 using an oligothiophene-arylene derivative prepared in Preparative Example 11.

The current transfer characteristics of an organic thin film transistor fabricated in Example 5 using an oligothiophene-arylene derivative prepared in Preparative Example 11 are graphically shown in FIG. 5.

Comparative Example 1

An organic thin film transistor was fabricated in the same manner as in Example 1, except that polyhexylthiophene HT-P3HT (Aldrich) was used.

Evaluation of Electrical Properties of OTFTs

The charge carrier mobility of the devices fabricated in Examples 1-5 and Comparative Example 1 was measured. The current transfer characteristics of the devices were measured using a KEITHLEY semiconductor characterization system (4200-SCS), and curves were plotted. The obtained results are shown in Table 1. The charge carrier mobility was calculated from the following current equations in the saturation region.

The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_O$: capacitance of the oxide film, W: channel width, L: channel length; $V_G$: gate voltage, and $V_T$: threshold voltage.

The off-state leakage current ($I_{off}$) is a current flowing in the off-state, and was determined from the minimum current in the off-state.

TABLE 1

| Organic active layer | Charge carrier mobility (cm²/Vs) | Off-state leakage current (A) |
| --- | --- | --- |
| Example 1 | 0.001 | $3 \times 10^{-11}$ |
| Example 2 | 0.0003 | $1 \times 10^{-9}$ |
| Example 3 | 0.0002 | $1 \times 10^{-10}$ |
| Example 4 | 0.0004 | $1 \times 10^{-9}$ |
| Example 5 | 0.0004 | $1 \times 10^{-10}$ |
| Comparative Example 1 (HT-P3HT) | 0.01 | $1 \times 10^{-8}$ |

As can be seen from the data shown in Table 1, the oligothiophene-arylene derivatives of the present invention showed a high charge carrier mobility ranging from 0.001 to 0.0003 and a considerably low off-state leakage current.

As apparent from the foregoing, the oligothiophene-arylene derivatives of the present invention are low molecular weight organic semiconductor materials with a novel structure. In addition, since the oligothiophene-arylene derivatives can be spin-coated at room temperature, are stable, and exhibit high charge carrier mobility and low off-state leakage current, they can be used as a material for an active layer of an OTFT.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor comprising a substrate, a gate electrode, a gate insulating film, an organic active layer and source-drain electrodes wherein the organic active layer is made of the oligothiophene-arylene derivative according to an oligothiophene-arylene derivative of Formula 1:

(1)

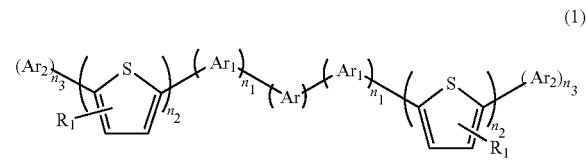

wherein

Ar is a $C_{2-30}$ heteroarylene interrupted by at least one nitrogen atom which may be substituted with hydrogen, hydroxyl, amino, a $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

$Ar_1$ is a $C_{2-30}$ aryl group which may be interrupted by at least one heteroatom and may be substituted with $C_{1-20}$ linear, branched or cyclic alkyl, $Ar_2$ is a $C_{5-30}$ aryl group which may be interrupted by at least one heteroatom and may be substituted with hydrogen, hydroxyl, amino, $C_{1-20}$ linear, branched or cyclic alkyl, $C_{1-20}$ alkoxyalkyl, alkylamino, ester or amido, or $C_{1-16}$ linear, branched or cyclic alkoxy, alkylamino, ester or amido;

the substituents $R_1$ are each independently hydrogen, hydroxyl, amino, $C_{1-20}$ linear, branched or cyclic alkyl, $C_{1-20}$ alkoxyalkyl, alkylamino, ester, amido, or a $C_{1-16}$ linear, branched or cyclic alkoxy, alkylamino, ester or amido;

$n_1$ is 1;

$n_2$ is an integer between 2 and 8; and $n_3$ is an integer between 0 and 6.

2. The organic thin film transistor according to claim 1, wherein the organic active layer is formed into a thin film by screen printing, printing, spin coating, dipping, or ink spraying.

3. The organic thin film transistor according to claim 1, wherein the insulating layer is made of a ferroelectric insulator selected from the group consisting of $Ba_{0.33}Sr_{0.66}TiO_3$, $Al_2O_3$, $Ta_2O_5$, $La_2O_5$, $Y_2O_3$, and $TiO_2$; an inorganic insulator selected from the group consisting of $PbZr_{0.33}TiO_{0.66}O_3$, $Bi_4Ti_3O_{12}$, $BaMgF_4$, $SrBi_2(TaNb)_2O_9$, $Ba(ZrTi)O_3$, $BaTiO_3$, $SrTiO_3$, $Bi_4Ti_3O_{12}$, $SiO_2$, $SiN_x$, and AlON; or an organic insulator selected from the group consisting of polyimides, benzocyclobutenes, parylenes, polyacrylates, polyvinylalcohols, and polyvinylphenols.

4. The organic thin film transistor according to claim 1, wherein the substrate is made of a material selected from the group consisting of glass, polyethylenenaphthalate, polyethyleneterephthalate, polycarbonate, polyvinylalcohol, polyacrylate, polyimide, polynorbornene, and polyethersulfone.

5. The organic thin film transistor according to claim 1, wherein the gate electrode and source-drain electrodes are made of a material selected from the group consisting of gold, silver, aluminum, nickel, and indium tin oxide.

* * * * *